United States Patent
Chen et al.

(10) Patent No.: US 8,340,308 B2
(45) Date of Patent: Dec. 25, 2012

(54) METHOD AND APPARATUS FOR AUTOMATIC NOISE COMPENSATION USED WITH AUDIO REPRODUCTION EQUIPMENT

(75) Inventors: Yin-Shan Chen, Tainan County (CN); Che-Ming Lin, Tainan County (CN); Chien-Ming Wu, Taipei (CN); Chia-Shin Yen, Taipei County (CN)

(73) Assignee: Panasonic Corporation, Osaka (JP)

( * ) Notice: Subject to any disclaimer, the term of this patent is extended or adjusted under 35 U.S.C. 154(b) by 996 days.

(21) Appl. No.: 12/376,337

(22) PCT Filed: Oct. 18, 2007

(86) PCT No.: PCT/JP2007/070769
§ 371 (c)(1),
(2), (4) Date: Feb. 4, 2009

(87) PCT Pub. No.: WO2008/047945
PCT Pub. Date: Apr. 24, 2008

(65) Prior Publication Data
US 2010/0290633 A1    Nov. 18, 2010

(30) Foreign Application Priority Data
Oct. 20, 2006   (CN) .......................... 2006 1 0136055

(51) Int. Cl.
*H04R 29/00* (2006.01)
(52) U.S. Cl. .............. 381/56; 381/57; 381/74; 381/104; 381/109; 381/102
(58) Field of Classification Search ............ 381/57, 381/74, 56, 104, 109, 107
See application file for complete search history.

(56) References Cited

U.S. PATENT DOCUMENTS

| | | | |
|---|---|---|---|
| 5,907,622 A | 5/1999 | Dougherty | |
| 2002/0005857 A1 | 1/2002 | Kasahara et al. | |
| 2003/0123680 A1* | 7/2003 | Lee et al. | 381/104 |
| 2005/0069154 A1 | 3/2005 | Yamazaki et al. | |
| 2005/0195994 A1* | 9/2005 | Saito et al. | 381/102 |
| 2008/0192948 A1 | 8/2008 | Kan et al. | |

(Continued)

FOREIGN PATENT DOCUMENTS

DE            2752657            6/1979
(Continued)

OTHER PUBLICATIONS

English language Abstract of JP 58-47308, Mar. 19, 1983.
English language Abstract of DE 19749372, May 12, 1999.

(Continued)

*Primary Examiner* — Steven Loke
*Assistant Examiner* — Cuong Nguyen
(74) *Attorney, Agent, or Firm* — Greenblum & Bernstein, P.L.C.

(57) ABSTRACT

A method and an apparatus for automatic noise compensation used with audio reproduction equipment are provided. The method comprises: (a) collecting a plurality of mixed audio signals, each mixed audio signal including equipment sound output by the audio reproduction equipment, and background noise; (b) removing the equipment sound from the mixed audio signals to obtain the background noise therein; (c) determining whether or not a plurality of mixed audio signals under inspection include a significant sound; and (d) adjusting the volume of the audio reproduction equipment according to whether or not a significant sound has been generated in the surrounding area and the magnitude of the background noise in the mixed audio signals under inspection to satisfy a plurality of predetermined compensation conditions.

22 Claims, 2 Drawing Sheets

U.S. PATENT DOCUMENTS

2008/0260040 A1  10/2008  Ouyang et al.

FOREIGN PATENT DOCUMENTS

| DE | 3046862 | 6/1982 |
| DE | 19749372 | 5/1999 |
| JP | 58-47308 | 3/1983 |
| JP | 2-274007 | 11/1990 |
| JP | 9-146588 | 6/1997 |

OTHER PUBLICATIONS

Partial English language translation of DE 3046862 A1, Jun. 16, 1982.
English language translation of DE 2752657 A1, Jun. 7, 1979.
Japan Office Action, mailed Jan. 31, 2012, for correponding Japanese Patent Application.

* cited by examiner

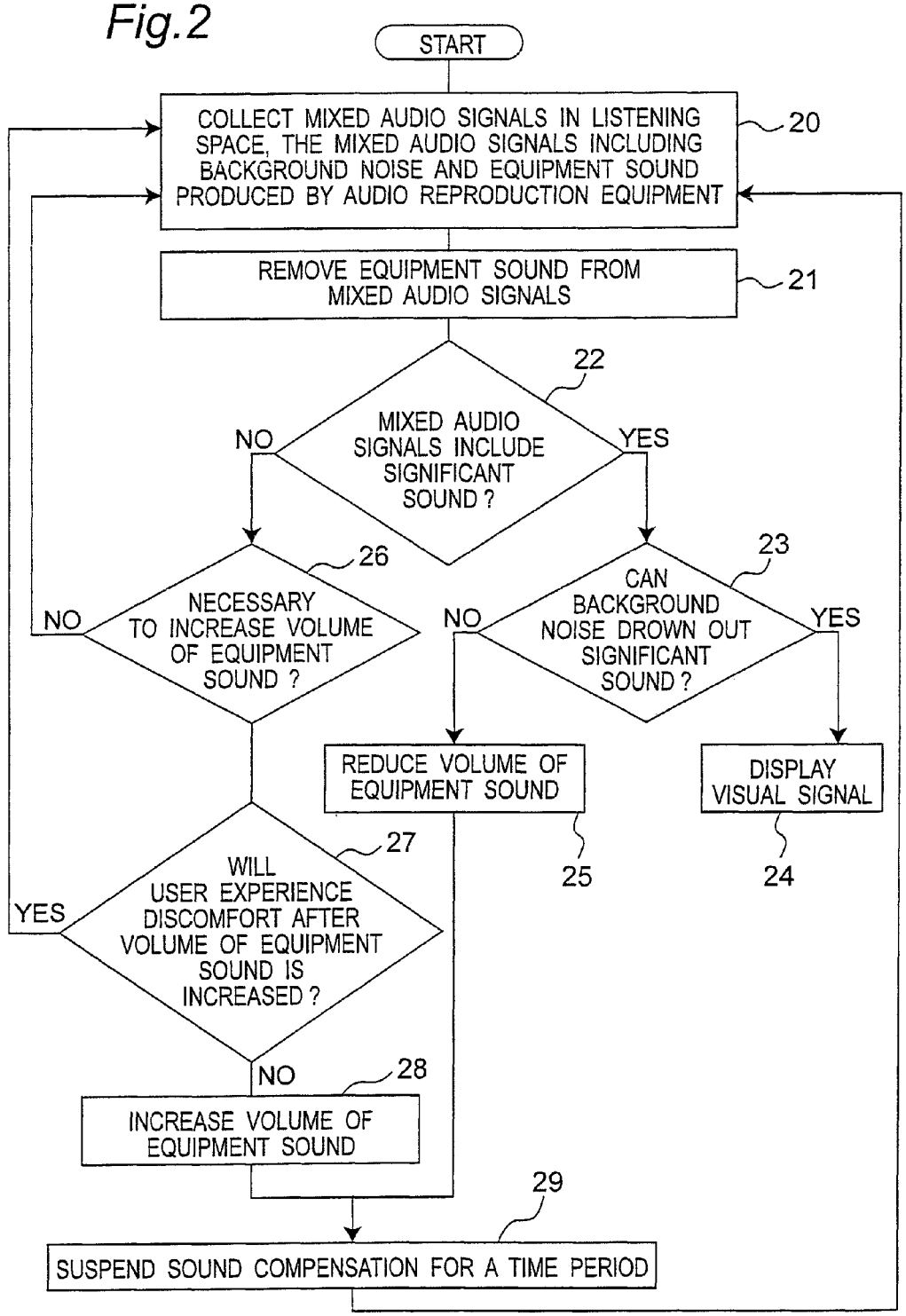

METHOD AND APPARATUS FOR AUTOMATIC NOISE COMPENSATION USED WITH AUDIO REPRODUCTION EQUIPMENT

TECHNICAL FIELD

The present invention relates to a method and apparatus for automatic noise compensation, and more particularly to a method and apparatus for automatic noise compensation used with audio reproduction equipment that are able to alert a user that a significant sound has been generated in his or her surrounding area.

BACKGROUND ART

When people are in an area where there are continuous loud noises or sound, it is not possible for them to clearly hear sounds that they desire to hear. For example, noise generated by an air conditioner in a living room or noise from outside may often interfere with sounds that people desire to hear.

Such sounds desired to be heard by people may be generated by entertainment or multimedia equipment, such as a television or a radio. Actually, the volume perceived by a listener is a function of noise, and when the noise increases, the listener will perceive a lower volume. If the listener desires to maintain the quality of perceived volume at a constant level, he or she must adjust the volume according to the loudness of the ambient noise.

U.S. Pat. No. 5,907,622, entitled "AUTOMATIC NOISE COMPENSATION SYSTEM FOR AUDIO REPRODUCTION EQUIPMENT," disclosed a system that produces an audio signal in a listening space. The system comprises a number of elements that may be used for generating a desired volume signal and a noise signal representative of ambient noise conditions in the listening space. The system further comprises a variable gain amplifier for amplifying the audio signal according to a gain control signal, and a device for generating the gain control signal according to a volume control signal. The volume control signal is generated according to the noise and desired volume signal, such that the volume control signal increases in accordance with increases in the noise signal.

From the aforementioned, U.S. Pat. No. 5,907,622 disclosed a way of increasing the gain of the audio signal according to the energy of ambient sound so as to prevent sounds which are desired to be heard from being drowned out by ambient sound. However, this patent has the following drawbacks: since the gain is adjusted according to the volume level of ambient sound, if there is also a significant sound in the ambient sound, the significant sound will be drowned out by audio signals that are increased in gain due to an increase in the ambient sound. In such a situation, people will not take notice of the significant sound.

In United States Patent Application Publication No. 20050069154 A1, entitled "ELECTRONIC APPARATUS THAT ALLOWS SPEAKER VOLUME CONTROL BASED ON SURROUNDING SOUND VOLUME AND METHOD OF SPEAKER VOLUME CONTROL," when power is turned on, a speaker volume control section is able to obtain the volume of ambient sound from a microphone to determine the output volume of a speaker. The speaker volume control section then displays the value of the output volume of the speaker thus determined on a liquid crystal display (LCD). Subsequently, the speaker volume control section monitors whether or not the user has changed the speaker volume. If the user does not change the speaker volume within a predetermined period of time, the speaker volume control section informs a sound controller of the determined speaker volume. On the other hand, if the user changes the speaker volume, the speaker volume control section informs the sound controller of the volume designated by the user.

From the aforementioned, the patent application publication US 20050069154 was designed to compensate for noise generated when a user was listening to sound, and used a determination unit to determine the value of the output volume of the speaker according to the volume of sound received by the microphone. However, the disadvantage of this patent application resides in the fact that after the gain is applied to the desired listening signal, the microphone receives the ambient sound that also includes the desired listening signal that has been amplified. As a result, in this prior art technique, since the sound volume received by the microphone is increased as the volume of the desired listening signal is increased, it will be determined that the desired listening signal must be amplified further. Therefore, this prior art technique is unable to provide an accurate gain for amplifying desired listening sound signals.

DISCLOSURE OF INVENTION

Therefore, the object of this invention is to provide an automatic noise compensation method used with audio reproduction equipment that can automatically adjust the volume of the audio reproduction equipment according to whether or not a significant sound has been generated in the surrounding area and the volume of background noise, and that can alert a user that a significant sound has been generated in his or her surrounding area.

Accordingly, the automatic noise compensation method used with audio reproduction equipment of the present invention comprises the following steps: (a) collecting a plurality of mixed audio signals, each mixed audio signal including equipment sound output by the audio reproduction equipment, and background noise; (b) removing the equipment sound from the mixed audio signals to obtain the background noise therein; (c) determining whether or not a plurality of mixed audio signals under inspection include a significant sound; (d) if the determination of step (c) is affirmative, further determining if the energy of the background noise in the mixed audio signals under inspection is greater or smaller than the energy of the significant sound, wherein if the energy of the background noise is smaller than the energy of the significant sound, the volume of the audio reproduction equipment is adjusted according to the energy of the significant sound and the background noise to satisfy a first compensation condition, and wherein if the energy of the background noise is greater than or equal to the energy of the significant sound, a visual signal is displayed for a user, thereby alerting the user to the generation of the significant sound in his or her surrounding area; and (e) if the determination of step (c) is negative, adjusting the volume of the audio reproduction equipment according to the energy of the background noise in the mixed audio signals under inspection to satisfy a second compensation condition.

Another object of this invention is to provide an automatic noise compensation apparatus used with audio reproduction equipment that can automatically adjust the volume of the audio reproduction equipment according to whether or not a significant sound has been generated in the surrounding area and the volume of background noise, and that can alert a user that a significant sound has been generated in his or her surrounding area.

Accordingly, the automatic noise compensation apparatus used with audio reproduction equipment of the present invention is adapted to alert a user to possible generation of a significant sound when the user is listening to equipment sound produced by the audio reproduction equipment in a listening space with background noise. The automatic noise compensation apparatus comprises a plurality of microphones, a sound-separating unit, an energy-calculating unit, a visual signal display unit, and a volume control unit. The microphones are used for collecting a plurality of mixed audio signals, where each mixed audio signal includes equipment sound output by the audio reproduction equipment, and the background noise. The sound-separating unit is used for removing the equipment sound from the mixed audio signals to obtain the background noise therein, and is used for determining whether or not a plurality of mixed audio signals under inspection include a significant sound. When the sound-separating unit determines that the mixed audio signals under inspection include the significant sound, the energy-calculating unit is used to calculate the energy of the equipment sound, the background noise, and the significant sound in the mixed audio signals under inspection, and determine their relative strength. When the energy of the background noise is greater than or equal to the energy of the significant sound, the visual signal display unit is used to display a visual signal for the user, thereby alerting the user to the generation of the significant sound in his or her surrounding area. When the energy of the background noise is smaller than the energy of the significant sound, the volume control unit adjusts the volume of the audio reproduction equipment according to the energy of the significant sound and the background noise to satisfy a plurality of predetermined compensation conditions.

BRIEF DESCRIPTION OF DRAWINGS

Other features and advantages of the present invention will become apparent in the following detailed description of the preferred embodiment with reference to the accompanying drawings, of which:

FIG. 2 is a flow chart, illustrating the preferred embodiment of an automatic noise compensation method used with audio reproduction equipment according to the present invention.

BEST MODE FOR CARRYING OUT THE INVENTION

Figure 1:
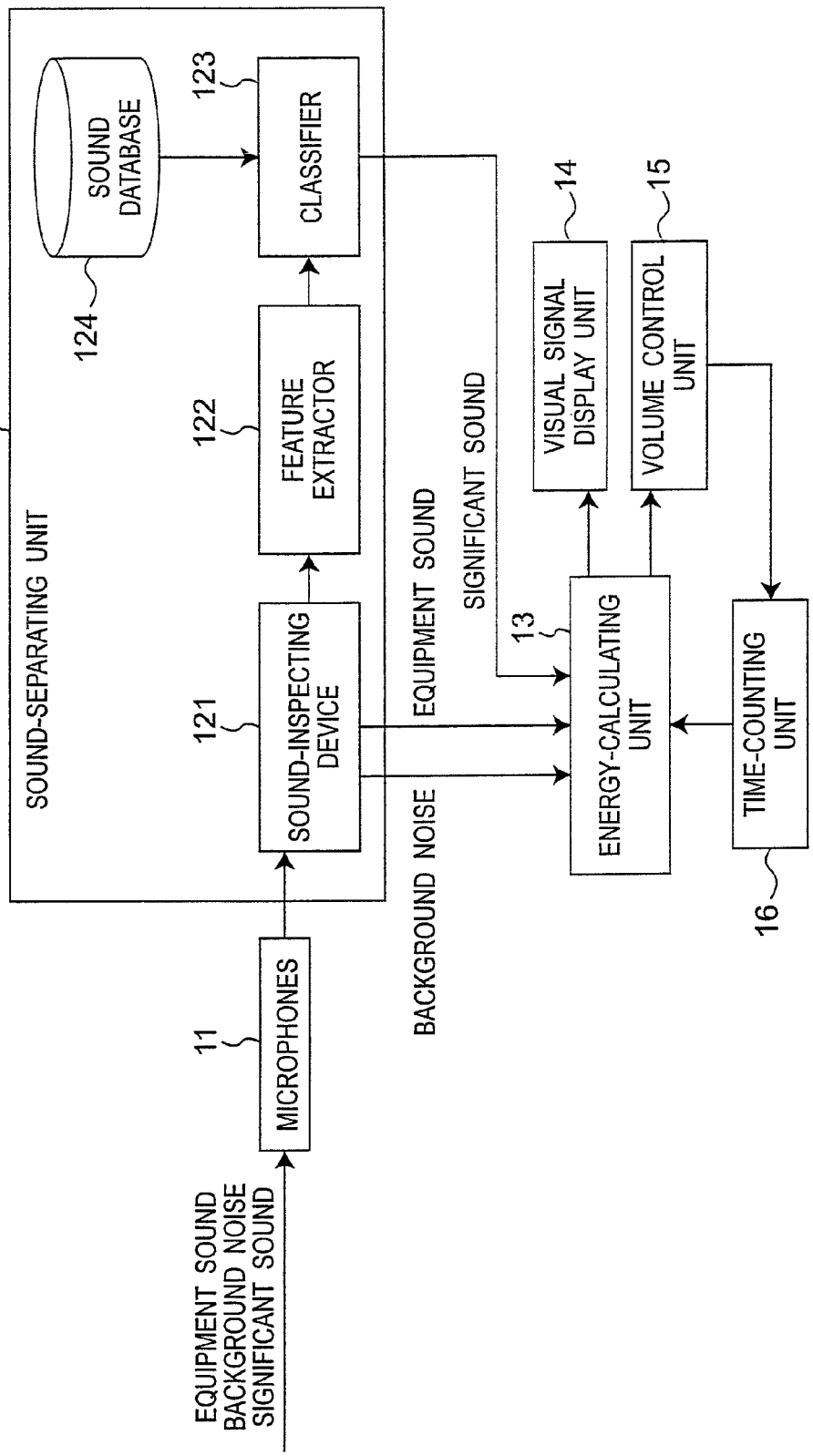
FIG. 1 is a functional block diagram, illustrating the preferred embodiment of an automatic noise compensation apparatus used with audio reproduction equipment according to the present invention.

Referring to FIG. 1, the preferred embodiment of an automatic noise compensation apparatus used with audio reproduction equipment according to the present invention is adapted to alert a user to possible generation of a significant sound when the user is listening to equipment sound produced by the audio reproduction equipment (not shown, for example, a television, a radio, or a DVD player) in a listening space with background noise. The automatic noise compensation apparatus comprises a plurality of microphones 11, a sound-separating unit 12, an energy-calculating unit 13, a visual signal display unit 14, a volume control unit 15, and a time-counting unit 16.

The microphones 11 are used to collect a plurality of mixed audio signals, where each mixed audio signal includes the equipment sound produced by the audio reproduction equipment and the background noise.

The sound-separating unit 12 is used to remove the equipment sound from the mixed audio signals to obtain the background noise therein, and is used to determine whether or not a plurality of mixed audio signals under inspection include a significant sound. The sound-separating unit 12 includes a sound-inspecting device 121, a feature extractor 122, a classifier 123, and a sound database 124.

For background noise that does not contain any significant sound, the sound-inspecting device 121 is used to calculate a frequency spectrum and an average value and standard deviation regarding energy thereof within a first time period, remove the equipment sound from the mixed audio signals under inspection to obtain the background noise therein, and determine whether or not the energy of the background noise is larger than the sum of the average value and standard deviation. If so, the calculated frequency spectrum is subtracted from the frequency spectrum of the background noise to obtain a plurality of separated signals. Here, the first time period may be, for example, from a few hundred milliseconds to one second. After receiving from the microphones 11 the mixed audio signals under inspection, the sound-inspecting device 121 may further subject the mixed audio signals under inspection to a suitable frequency or spatial-domain processing. For example, in the preferred embodiment, a bandpass filter may first be used, after which frequency-domain independent component analysis (FDICA) or directivity reception techniques may be used to remove background noise from the mixed audio signals under inspection to obtain the separated signals.

The feature extractor 122 is used to receive the separated signals transmitted from the sound-inspecting device 121, and calculate a feature value of the separated signals. For example, the feature value may be a Zero Crossing Rate (ZCR), a pitch, a Fast Fourier Transform (FFT) coefficient, or a Mel-Frequency Cepstral Coefficient (MFCC).

The sound database 124 is used to store a plurality of sound samples (i.e., their feature values) of predetermined significant sounds, such as telephone ringing sounds and doorbell sounds.

The classifier 123 receives the feature value of the separated signals transmitted from the feature extractor 122, and measures a similarity degree between the separated signals and each sound sample in the sound database 124 so as to determine whether or not the separated signals corresponds to one of the sound samples. If so, the separated signals represent a significant sound to which the user must be alerted. The techniques to measure the degree of similarity may be, for example, Euclidian Distance, Mahalanobis Distance, or Hidden Markov Model (HMM).

When the sound-separating unit 12 determines that the mixed audio signals under inspection contain a significant sound, the energy-calculating unit 13 is used to calculate the energy of the equipment sound, the background noise, and the significant sound in the mixed audio signals under inspection, and determine their relative strength. In addition, when the sound-separating unit 12 determines that the mixed audio signals under inspection do not contain a significant sound, the energy-calculating unit 13 is further used to determine whether or not the volume of the equipment sound needs to be increased. If it is necessary to increase the volume of the equipment sound, the energy-calculating unit 13 first determines whether or not the user will experience discomfort after the volume of the equipment sound is increased.

When the energy-calculating unit 13 determines that the energy of the background noise in the mixed audio signals under inspection is greater than or equal to the energy of the significant sound, the visual signal display unit 14 provides the display of a visual signal for the user, thereby alerting the user that a significant sound has been generated in his or her surrounding area.

When the energy-calculating unit 13 determines that the energy of the background noise in the mixed audio signals under inspection is smaller than the energy of the significant sound, the volume control unit 15 automatically reduces the volume of the equipment sound generated by the audio reproduction equipment. Moreover, in the aforementioned, when the energy-calculating unit 13 determines that the user will not experience discomfort after the volume of the equipment sound is increased, the volume control unit 15 automatically increases the volume of the equipment sound generated by the audio reproduction equipment.

After the volume control unit 15 automatically decreases or increases the volume of the equipment sound, the time-counting unit may be started to suspend the energy calculating and determining functions of the energy-calculating unit 13 for a second time period, so as to maintain the stability of the volume following adjustment. Here, the second time period must be larger than the time required to automatically reduce or increase the volume of the equipment sound, for example, 2 seconds.

Referring to FIGS. 1 and 2, the preferred embodiment of an automatic noise compensation method used with audio reproduction equipment according to the present invention comprises the following steps. First, in step 20, the microphones 11 are used to collect a plurality of mixed audio signals in a listening space.

Next, in step 21, for background noise that does not contain any significant sound, the sound-inspecting device 121 is used to calculate a frequency spectrum and an average value and standard deviation regarding energy thereof within the first time period, and remove the equipment sound from the mixed audio signals under inspection to obtain the background noise therein. The sound-inspecting device 121 further determines whether or not the energy of the background noise is larger than the sum of the average value and standard deviation. If so, the calculated frequency spectrum is further subtracted from the frequency spectrum of the background noise to obtain a plurality of separated signals.

Subsequently, in step 22, through the combined operations of the feature extractor 122, the classifier 123, and the sound database 124, it may be determined whether or not the separated signals correspond to one of the sound samples in the sound database 124. If so, this indicates that the separated signals represent a significant sound to which the user must be alerted, for example, a telephone ringing sound or a doorbell sound. Next, in step 23, the energy-calculating unit 13 is used to determine whether or not the background noise in the mixed audio signals under inspection drowns out the significant sound. That is, the energy-calculating unit 13 is used to determine whether or not the energy of the background noise is greater than or equal to the energy of the significant sound. If the determination result of step 23 is affirmative, in step 24, the visual signal display unit 14 automatically displays a visual signal for the user, thereby alerting the user that a significant sound has been generated in his or her surrounding area. For example, the visual signal may be displayed on the screen of a television or be realized by flashing an LED on a control panel of a radio or a DVD player.

On the other hand, if the determination result of step 23 is negative, in step 25, the volume control unit 15 automatically adjusts the volume of the audio reproduction equipment according to the energy of the significant sound and the background noise to satisfy a compensation condition, where the compensation condition may be as follows: the signal-to-noise ratio of the volume of the significant sound to the sum of the volume of the equipment sound and the background noise in the mixed audio signals under inspection must be greater than or equal to a first predetermined value, and the first predetermined value may be 10-20 decibels. Next, in step 29, the time-counting unit 16 suspends the energy calculating and determining functions of the energy-calculating unit 13 until the second time period has elapsed, after which the time-counting function of the time-counting unit 16 is stopped and the energy calculating and determining functions of the energy-calculating unit 13 are again started, such that the stability of the volume following adjustment is maintained.

If the determination result of step 22 is negative, in step 26, the energy-calculating unit 13 further determines whether or not the volume of the equipment sound needs to be increased. That is, the energy-calculating unit 13 determines whether or not the energy of the equipment sound and the energy of the background noise satisfy another compensation condition, where the compensation condition may be as follows: the signal-to-noise ratio of the volume of the equipment sound to the background noise in the mixed audio signals under inspection must be greater than or equal to a second predetermined value, and the second predetermined value may be 10-20 decibels. If so, in step 27, the energy-calculating unit 13 determines whether or not the user will experience ear discomfort after the volume of the equipment sound is increased. In other words, the energy-calculating unit 13 calculates in advance whether or not the sum of the volume of the equipment sound following adjustment and the background noise exceeds a predetermined pain threshold value, where the pain threshold value may be 100 decibels.

If the determination result of step 27 is affirmative, the volume control unit 15 does not need to adjust the volume of the equipment sound. On the other hand, if the determination result of step 27 is negative, in step 28, the volume control unit 15 automatically adjusts the volume of the equipment sound according to the energy of the background noise, such that the corresponding compensation condition is satisfied. Subsequently, in step 29, the time-counting unit 16 suspends the energy calculating and determining functions of the energy-calculating unit 13 until the second time period has elapsed, after which the time-counting function of the time-counting unit 16 is stopped and the energy calculating and determining functions of the energy-calculating unit 13 are again started, such that the stability of the volume following adjustment is maintained.

From the aforementioned, the automatic noise compensation method and apparatus used with audio reproduction equipment according to the present invention utilize the sound-separating unit 12 to remove equipment sound from mixed audio signals received by the microphones 11, and to separate the background noise and significant sounds. Further, the energy-calculating unit 13 is used to compare the energy of the equipment sound, the background noise, and a significant sound to determine whether or not it is necessary to alert the user through the visual signal display unit 14 to the generation of a significant sound in his or her surrounding area, or use the volume control unit 15 and the time-counting unit 16 to adjust and control the volume of the equipment sound.

While the present invention has been described in connection with what is considered the most practical and preferred embodiment, it is understood that this invention is not limited to the disclosed embodiment but is intended to cover various arrangements included within the spirit and scope of the

The invention claimed is:

1. An automatic noise compensation method used with audio reproduction equipment, which used a first time period and a second time period comprising:
(a) collecting a plurality of mixed audio signals, each mixed audio signal including equipment sound output by the audio reproduction equipment, and background noise;
(b) removing the equipment sound from the mixed audio signals to obtain the background noise therein;
(c) determining whether or not the plurality of mixed audio signals under inspection include a significant sound, and if the determination is affirmative, proceeding to (d); (d) when the energy of the background noise in the mixed audio signals under inspection is smaller than the energy of the significant sound, adjusting the volume of the audio reproduction equipment according to the energy of the significant sound and the background noise in the mixed audio signals under inspection to satisfy a first compensation condition, wherein, in (d), after automatically adjusting the volume of the equipment sound output by the audio reproduction equipment, performing (d) is suspended for the second time period so as to maintain the stability of the volume following adjustment; and if the determination is negative, proceeding to (e);(e) adjusting the volume of the audio reproduction equipment according to the energy of the background noise in the mixed audio signals under inspection to satisfy a second compensation condition.

2. The automatic noise compensation method used with audio reproduction equipment according to claim 1, wherein (c) includes:
(c1) under a condition where no significant sound is contained in the background noise obtained in (c), calculating a frequency spectrum and an average value and standard deviation regarding energy of the background noise within the first time period;
(c2) determining whether or not the energy of the background noise in the mixed audio signals under inspection is larger than the sum of the average value and the standard deviation, and if so, subtracting the frequency spectrum obtained in (c1) from the frequency spectrum of the background noise in the mixed audio signals under inspection to obtain a plurality of separated signals; and
(c3) determining whether or not the separated signals correspond to a sound sample in a sound database, and if so, the separated signals represent the significant sound.

3. The automatic noise compensation method used with audio reproduction equipment according to claim 1, wherein the first compensation condition in (d) is as follows: a signal-to-noise ratio of the volume of the significant sound to a sum of the volume of the equipment sound and the background noise in the mixed audio signals under inspection must be greater than or equal to a predetermined value.

4. The automatic noise compensation method used with audio reproduction equipment according to claim 3, wherein the predetermined value ranges from 10 to 20 decibels.

5. The automatic noise compensation method used with audio reproduction equipment according to claim 1, wherein the second time period must be larger than a time required to automatically adjust the volume of the equipment sound.

6. The automatic noise compensation method used with audio reproduction equipment according to claim 1, wherein (d) includes:
when the energy of the background noise in the mixed audio signals under inspection is not smaller than the energy of the significant sound, displaying a visual signal for a user, thereby alerting the user that the significant sound has been generated in his or her surrounding area.

7. The automatic noise compensation method used with audio reproduction equipment according to claim 1,
wherein the second compensation condition in (e) is as follows: a signal-to-noise ratio of the volume of the equipment sound to the background noise in the mixed audio signals under inspection must be greater than or equal to a predetermined value, and a sum of the volume of the equipment sound following adjustment and the background noise in the mixed audio signals under inspection must not exceed a predetermined pain threshold value.

8. The automatic noise compensation method used with audio reproduction equipment according to claim 7,
wherein the predetermined value ranges from 10 to 20 decibels.

9. The automatic noise compensation method used with audio reproduction equipment according to claim 7,
wherein the predetermined pain threshold value is 100 decibels.

10. The automatic noise compensation method used with audio reproduction equipment according to claim 1,
wherein, in (e), after automatically adjusting the volume of the equipment sound output by the audio reproduction equipment, performing (e) is suspended for the second time period so as to maintain the stability of the volume following adjustment.

11. The automatic noise compensation method used with audio reproduction equipment according to claim 10,
wherein the second time period must be larger than a time required to automatically adjust the volume of the equipment sound.

12. An automatic noise compensation apparatus used with audio reproduction equipment, which used a first time period and a second time period comprising:
a plurality of microphones for collecting a plurality of mixed audio signals, each mixed audio signal including equipment sound and background noise;
a sound-separator for removing the equipment sound from the mixed audio signal to obtain the background noise, and for determining whether or not the plurality of mixed audio signals under inspection includes a significant sound;
an energy-calculator for calculating, when said sound-separator determines that the mixed audio signals under inspection include the significant sound, the energy of the equipment sound, the background noise, and the significant sound in the mixed audio signals under inspection, and for determining their relative strength;
a visual signal display for displaying, when the energy of the background noise in the mixed audio signals under inspection is not smaller than the energy of the significant sound, a visual signal for a user to alert the user that the significant sound has been generated in his or her surrounding area;

a volume controller for adjusting the volume of the equipment sound according to the energy of the significant sound and the background noise in the mixed audio signals under inspection to satisfy a plurality of predetermined compensation conditions; and a time-counter, said time-counter being started after said volume controller automatically adjusts the volume of the equipment sound to suspend the energy calculating and determining functions of said energy-calculator for the second time period, so as to maintain the stability of the volume following adjustment.

13. The automatic noise compensation apparatus used with audio reproduction equipment according to claim 12, wherein said sound-separator includes:

a sound-inspector for calculating, in a state where the background noise does not contain any significant sound, a frequency spectrum and an average value and standard deviation regarding energy of the background noise within the first time period, and for obtaining a plurality of separated signals from the mixed audio signals under inspection;

a feature extractor for calculating a feature value of the separated signals;

a sound database for storing a plurality of sound samples; and a classifier for receiving the feature value of the separated signals transmitted from said feature extractor, and, according to the sound samples in said sound database, for measuring a similarity degree between the separated signals and each of the sound samples so as to determine whether or not the separated signals correspond to one of the sound samples, and if so, the separated signals represent the significant sound.

14. The automatic noise compensation apparatus used with audio reproduction equipment according to claim 13, wherein said sound-inspector determines whether or not the energy of the background noise in the mixed audio signals under inspection is larger than a sum of the average value and the standard deviation regarding energy of the background noise thereof within the first time period, and if so, subtracts the calculated frequency spectrum from the frequency spectrum of the background noise in the mixed audio signals under inspection to obtain the separated signals.

15. The automatic noise compensation apparatus used with audio reproduction equipment according to claim 12, wherein the predetermined compensation conditions include: when the energy of the background noise in the mixed audio signals under inspection is smaller than the energy of the significant sound, said volume controller adjusts the volume of the audio reproduction equipment according to the energy of the significant sound and the background noise in the mixed audio signals under inspection to satisfy a first compensation condition.

16. The automatic noise compensation apparatus used with audio reproduction equipment according to claim 15, wherein the first compensation condition is as follows: a signal-to-noise ratio of the volume of the significant sound to the sum of the volume of the equipment sound and the background noise in the mixed audio signals under inspection must be greater than or equal to a first predetermined value.

17. The automatic noise compensation apparatus used with audio reproduction equipment according to claim 16, wherein the first predetermined value ranges from 10 to 20 decibels.

18. The automatic noise compensation apparatus used with audio reproduction equipment according to claim 17, wherein the predetermined compensation conditions include: when said sound-separator determines that the mixed audio signals under inspection does not include the significant sound, said volume controller adjusts the volume of the audio reproduction equipment according to the energy of the background noise in the mixed audio signals under inspection to satisfy a second compensation condition.

19. The automatic noise compensation apparatus used with audio reproduction equipment according to claim 18, wherein the second compensation condition is as follows: the signal-to-noise ratio of the volume of the equipment sound to the background noise in the mixed audio signals under inspection must be greater than or equal to a second predetermined value, and the sum of the volume of the equipment sound following adjustment and the background noise in the mixed audio signals under inspection must not exceed a predetermined pain threshold value.

20. The automatic noise compensation apparatus used with audio reproduction equipment according to claim 18, wherein the second predetermined value ranges from 10 to 20 decibels.

21. The automatic noise compensation apparatus used with audio reproduction equipment according to claim 19, wherein the predetermined pain threshold value is 100 decibels.

22. The automatic noise compensation method used with audio reproduction equipment according to claim 12, wherein the second time period must be larger than the time required to automatically adjust the volume of the equipment sound.

* * * * *